US010423738B1

(12) United States Patent
Zhao (10) Patent No.: US 10,423,738 B1
(45) Date of Patent: Sep. 24, 2019

(54) SYSTEMS AND METHODS FOR ELECTROMAGNETIC FIELD ANALYSIS

(71) Applicant: Ansys, Inc., Canonsburg, PA (US)

(72) Inventor: Kezhong Zhao, Wexford, PA (US)

(73) Assignee: Ansys, Inc., Canonsburg, PA (US)

( * ) Notice: Subject to any disclaimer, the term of this patent is extended or adjusted under 35 U.S.C. 154(b) by 703 days.

(21) Appl. No.: 15/015,226

(22) Filed: Feb. 4, 2016

Related U.S. Application Data (60) Provisional application No. 62/134,135, filed on Mar. 17, 2015, provisional application No. 62/112,787, filed on Feb. 6, 2015.

(51) Int. Cl.
G06F 17/50 (2006.01)
G06F 17/16 (2006.01)

(52) U.S. Cl.
CPC .......... *G06F 17/5018* (2013.01); *G06F 17/16* (2013.01)

(58) Field of Classification Search
CPC .............................. G06F 17/5018; G06F 17/16
USPC ............................................................. 703/2
See application file for complete search history.

(56) References Cited

U.S. PATENT DOCUMENTS

| 8,510,091 | B1 | 8/2013 | Zhao et al. | |
|---|---|---|---|---|
| 2014/0353005 | A1* | 12/2014 | Nair | H05K 1/0306 174/250 |

OTHER PUBLICATIONS

Zhao_2008 (A Domain Decomposition Method for Electromagnetic Radiation and Scattering Analysis of Multi-Target Problems IEEE Transactions on Antennas and Propagation, vol. 56, . Aug. 8, 2008).*
Zhao_2006 (Solving Electromagnetic Problems Using a Novel Symmetric FEM-BEM Approach IEEE Transactions on Magnetics, vol. 42, No. 4 Apr. 2006).*
Djordjevic_2005 ("Higher order hybrid method of moments-physical optics modeling technique for radiation and scattering from large perfectly conducting surface," IEEE Trans. Antennas Propag., vol. 53, No. 2, pp. 800-813, Feb. 2005).*
Sydanheimo_2003 (Folded Dipole Antenna Near Metal Plate, IEEE 2003).*
Olszewska_2011 (A Dual Reflector Antenna for Point-to-Point System Applications, vol. 119 2011 Acta Physica Polonica No. 4).*

(Continued)

*Primary Examiner* — Brian S Cook
(74) *Attorney, Agent, or Firm* — Jones Day (57) ABSTRACT

Systems and methods are provided for analyzing an electromagnetic field in an original domain. An original domain is decomposed into one or more finite-element-boundary-integral (FEBI) regions and one or more integral-equation (IE) regions. A model is determined for an electromagnetic field in the one or more FEBI regions and the one or more IE regions. An initial block system matrix for the original domain is generated based at least in part on the model. The initial block system matrix includes a first diagonal block corresponding to the one or more FEBI regions and a second diagonal block corresponding to the one or more IE regions. A replacement matrix is generated based at least in part on a physical optics (PO) method. A final block system matrix is generated by replacing the second diagonal block in the initial block system matrix with the replacement matrix.

23 Claims, 7 Drawing Sheets

(56) References Cited

OTHER PUBLICATIONS

Kruesi_2009 (Design and Development of a Novel 3-D Cubic Antenna for Wireless Sensor Networks (WSNs) and RFID Applications IEEE transactions on Antennas and Propagation, vol. 57 No. 10, Oct. 2009 ).*

Tasi_1969 (Theory of Cylindrical Dipole on a Sphere, Ohio state university, May 1969).*

Termos_2004 (Termos, A.; Hochwald, B.M. Capacity benefits of antenna coupling. Information Theory and Applications (ITA); , 2004; pp. 1-5.*

Edlund_2003 (Iterative solution of a hybrid method for Maxwell's equations in the frequency domain, International Journal for Numerical Methods in Engineering, Int. J. Numer. Meth. Engng 2003; 56:1755-1770).*

Jin, Jianming; The Finite Element Method in Electromagnetics, 2d Ed.; John Wiley & Sons; New York: NY; 2002, Only Index Reviewed Because Index Only Provided.

Yuan, Xingchao; Three-Dimensional Electromagnetic Scattering From Inhomogeneous Objects by the Hybrid Moment and Finite Element Method; IEEE Transactions on Microwave Theory and Techniques, 38(8); pp. 1053-1058; Aug. 1990.

Vouvakis, Marinos, Lee, Seung-Cheol, Zhao, Kezhong, Lee, Jin-Fa; A Symmetric FEM-IE Formulation with a Single-Level IE-QR Algorithm for Solving Electromagnetic Radiation and Scattering Problems; IEEE Transactions on Antennas and Propagation, 52(11); pp. 3060-3070; Nov. 2004.

Tzoulis, Andreas, Eibert, Thomas; A Hybrid FEBI-MLFMM-UTD Method for Numerical Solution of Electromagnetic Problems Including Arbitrarily Shaped and Electrically Large Objects; IEEE Transactions Antennas and Propagation, 53(10); pp. 3358-3366; Oct. 2005.

Edlund, Johan, Lotstedt, Per, Strand, Bo; Iterative Solution of a Hybrid Method for Maxwell's Equations in Frequency Domain; International Journal of Numerical Methods in Engineering, 56(12); pp. 1755-1770; Mar. 2003.

Cools, Kristof, Andriulli, Francesco, De Zutter, Daniel, Michielssen, E.; Accurate and Conforming Mixed Discretization of the MFIE; IEEE Antennas and Wireless Propagation Letters, 10; pp. 528-531; 2011.

Anriulli, Francesco, Cools, Kristof, Bagci, Hakan, Olyslager, Femke, Buffa, Annalisa, Christiansen, Snorre, Michielssen, Eric; A Mutliplicative Calderon Preconditioner for the Electric Field Integral Equation; IEEE Transactions on Antennas and Propagation, 56(8); pp. 2398-2412; Aug. 2008.

Vouvakis, Marinos, Zhao, Kezhong, Seo, Seung-Mo, Lee, Jin-Fa; A Domain Decomposition Approach for Non-Conformal Couplings Between Finite and Boundary Elements for Unbounded Electromagnetic Problems in R3; Journal of Computational Physics, 225(1); pp. 975-994; Jul. 2007.

Nedelec, Jean-Claude; Acoustic and Electromagnetic Equations: Integral Representations and Harmonic Problems, vol. 144; Springer: Berlin, Germany; 2001, Only Index Reviewed Because Only Index Provided.

Buffa, A., Ciarlet, Jr., P.; On Traces for Functional Spaces Related to Maxwell's Equations Part II: Hodge Decompositions on the Boundary of Lipschitz Polyhedra and Applications; Mathematical Methods in the Applied Sciences, 24; pp. 31-48; 2001.

Zhao, Kezhong, Rawat, Vineet, Lee, Seung-Cheol, Lee, Jin-Fa; A Domain Decomposition Method With Nonconformal Meshes for Finite Periodic an Semi-Periodic Structures; IEEE Transactions on Antennas and Propagation, 55(9); pp. 2559-2570; Sep. 2007.

Lee, Seung-Cheol, Vouvakis, Marinos, Lee, Jin-Fa; A Non-Overlapping Domain Decomposition Method for Non-Matching Grids for Modeling Large Finite Antenna Arrays; Journal of Computational Physics, 203(1); pp. 1-21; Feb. 2005.

Rengarajan, S.R., Gillespie, E.S.; Asymptotic Approximations in Radome Analysis; IEEE Transactions on Antennas and Propagation, 36(3); pp. 405-414; Mar. 1988.

* cited by examiner

SYSTEMS AND METHODS FOR ELECTROMAGNETIC FIELD ANALYSIS

CROSS-REFERENCE TO RELATED APPLICATIONS

This disclosure claims priority to and benefit from U.S. Provisional Patent Application No. 62/112,787, filed on Feb. 6, 2015, and U.S. Provisional Patent Application No. 62/134,135, filed Mar. 17, 2015, the entirety of both applications being incorporated herein by reference.

TECHNICAL FIELD

The present disclosure relates generally to the field of computational simulations, and, more specifically, to processor-implemented systems and methods for simulations of electromagnetic fields.

BACKGROUND

Electromagnetic fields can often be simulated over an original domain, e.g., a surface or a volume specified geometrically. Specifically, the original domain is divided into one or more discrete sub-domains. Field-governing equations and applicable boundary conditions are modeled with a system matrix equation (e.g., a large linear system of equations that describe the behavior of a field within the discretized domain). Many approaches may be adopted for analysis of electromagnetic fields, such as the finite element method (FEM), the boundary element method (BEM), the integral equation method, and the finite different method (FDM).

For example, electromagnetic fields can be simulated using a discretized formulation of Maxwell's equations. FEM may model complex heterogeneous and anisotropic materials and represent geometrically complicated domains using, for example, tetrahedral elements, and thus is widely used to set up a system matrix equation. In essence, FEM is a numerical technique for finding approximate solutions of partial differential equations (e.g., Maxwell's equations) which often lack exact mathematical ("analytical") solutions. FEM often represents a surface or a spatial volume as many small component elements. The discretization may be accomplished by defining a mesh grid (e.g., a triangular, tetrahedral, or other polygonal mesh) over the domain. The components of the electromagnetic field may then be expressed in a form suitable to the discretized domain. For example, the fields may be represented in a finite-dimensional function space of piecewise polynomial functions (e.g., piecewise linear functions), and the piecewise polynomial functions can be described as linear combinations of basis functions, or "finite elements." The boundary value problem that describes the behavior of the fields in the domain (e.g., the field-governing equations and boundary conditions) is usually rephrased in a weak form, or a variational form before discretization.

Usually, FEM results in a matrix equation which may then be solved with a direct solver or an iterative solver, depending on the size and characteristics of the linear system. A direct solver corresponds to a method for directly solving a system of equations, or a computer program implementing such a method, as determined by context. For large three-dimensional problems, a direct solver may require prohibitive amounts of memory and suffer poor parallel scalability. Therefore, an iterative solver which corresponds to an iterative method for solving a system of equations or a computer program implementing such a method usually presents a practical means for solving large systems. The iterative solver often approaches the problem in successive steps, where each step refines a previous approximation to more closely approach an exact solution. A preconditioner (e.g., a matrix that reduces a condition number of the problem which in turn is a metric of the propagation of approximation errors during a numerical solution) is often applied to the original system matrix to reduce the number of necessary iterations.

The domain decomposition method (DDM) may be used to facilitate parallel solution of large electromagnetic problems and also provide an efficient and effective preconditioner. Specifically, an original domain of a problem is decomposed into several (e.g., non-overlapping and possibly repetitive) sub-domains. For example, a cuboid spatial domain may be divided into a series of smaller adjacent cubes. The continuity of electromagnetic fields at the interfaces between adjacent sub-domains is enforced through suitable boundary conditions (i.e., transmission conditions). The sub-domain boundaries may not represent actual physical boundaries, and may be introduced merely for computational convenience. Transmission conditions often specify how the fields behave at those sub-domain boundaries to ensure that the solution obtained by domain decomposition is consistent with a solution for the undivided domain (i.e., a problem formulation wherein the boundaries do not exist). For example, transmission conditions may specify that the fields, or their derivatives, are continuous across a sub-domain boundary. For problems involving electromagnetic fields, sub-domain problems are often well-posed and convergence occurs at an acceptable rate if Robin transmission conditions are imposed on the boundaries between sub-domains. Robin transmission conditions usually express these requirements in terms of particular combinations of fields, currents, and their derivatives.

However, the above-noted methods may not be sufficient alone for accurate simulation of electrically large and geometrically complicated electromagnetic problems. Instead, a hybrid method which combines a plurality of solvers may be needed. For example, for unbounded exterior problems such as an antenna radiating in free space, a hybrid finite element boundary integral (FEBI) formulation has been widely accepted as a hybrid extension to the traditional FEM method. To further extend FEM's capability to the solution of electromagnetic radiation and scattering problems involving disjoint obstacles, such as reflector antenna system, antennas mounted on large platforms, and antennas in the presence of radome structures, several methods, such as method of moments (MoM), physical optics (PO), etc., are hybridized with FEM.

A hybrid method may include the following process. An original domain is divided into one or more sub-domains. Once the solution of a sub-domain is obtained, the Huygen's equivalent sources (i.e., electric and magnetic current sources) are computed. These sources generate incident fields which subsequently impinge on all other sub-domains and make each sub-domain a well-defined scattering problem. This process continues until no significant change in the scattered fields of the sub-domains. Many hybrid methods implemented the above-noted process through a black-box approach. That is, incident fields generated by equivalent sources are represented by universal basis functions, such as nodal elements. These fields are then taken as incident fields via interpolation for each solver. Thus, the coupling of various solvers may be simple to implement requiring minor code changes. However, the black-box approach may be inherently sequential and a stationary iterative process is often used in the iteration process. Many hybrid methods may fail to handle geometrically complicated and electrically large sub-domains rigorously and efficiently.

SUMMARY

As disclosed herein, processor-implemented systems and methods are provided for analyzing an electromagnetic field in an original domain. An original domain is decomposed into one or more finite-element-boundary-integral (FEBI) regions and one or more integral-equation (IE) regions. A model is determined for an electromagnetic field in the one or more FEBI regions and the one or more IE regions. A truncation surface of the FEBI regions is modeled using one or more Robin-type transmission conditions between a first set of variables and a second set of variables. The first set of variables is associated with a finite element method and the second set of variables is associated with a boundary integral method. An initial block system matrix for the original domain is generated based at least in part on the model. The initial block system matrix includes a first diagonal block corresponding to the one or more FEBI regions and a second diagonal block corresponding to the one or more IE regions. A replacement matrix is generated based at least in part on a physical optics (PO) method. A final block system matrix is generated by replacing the second diagonal block in the initial block system matrix with the replacement matrix. Initial matrix data associated with the initial block system matrix and final matrix data associated with the final block system matrix are stored in a matrix data structure in a non-transitory computer-readable medium.

As an example, a processor-implemented system is provided for analyzing an electromagnetic field in an original domain. The system includes: one or more data processors; and one or more computer-readable storage media. The storage media are encoded with instructions for commanding the one or more data processors to execute certain operations. An original domain is decomposed into one or more finite-element-boundary-integral (FEBI) regions and one or more integral-equation (IE) regions. A model is determined for an electromagnetic field in the one or more FEBI regions and the one or more IE regions. A truncation surface of the FEBI regions is modeled using one or more Robin-type transmission conditions between a first set of variables and a second set of variables. The first set of variables is associated with a finite element method and the second set of variables is associated with a boundary integral method. An initial block system matrix for the original domain is generated based at least in part on the model. The initial block system matrix includes a first diagonal block corresponding to the one or more FEBI regions and a second diagonal block corresponding to the one or more IE regions. A replacement matrix is generated based at least in part on a physical optics (PO) method. A final block system matrix is generated by replacing the second diagonal block in the initial block system matrix with the replacement matrix. Initial matrix data associated with the initial block system matrix and final matrix data associated with the final block system matrix are stored in a matrix data structure in a non-transitory computer-readable medium.

As another example, a computer-readable medium encoded with instructions for commanding one or more data processors to execute operations of a method for analyzing an electromagnetic field in an original domain. An original domain is decomposed into one or more finite-element-boundary-integral (FEBI) regions and one or more integral-equation (IE) regions. A model is determined for an electromagnetic field in the one or more FEBI regions and the one or more IE regions. A truncation surface of the FEBI regions is modeled using one or more Robin-type transmission conditions between a first set of variables and a second set of variables. The first set of variables is associated with a finite element method and the second set of variables is associated with a boundary integral method. An initial block system matrix for the original domain is generated based at least in part on the model. The initial block system matrix includes a first diagonal block corresponding to the one or more FEBI regions and a second diagonal block corresponding to the one or more IE regions. A replacement matrix is generated based at least in part on a physical optics (PO) method. A final block system matrix is generated by replacing the second diagonal block in the initial block system matrix with the replacement matrix. Initial matrix data associated with the initial block system matrix and final matrix data associated with the final block system matrix are stored in a matrix data structure in a non-transitory computer-readable medium.

DETAILED DESCRIPTION

Figure 1:
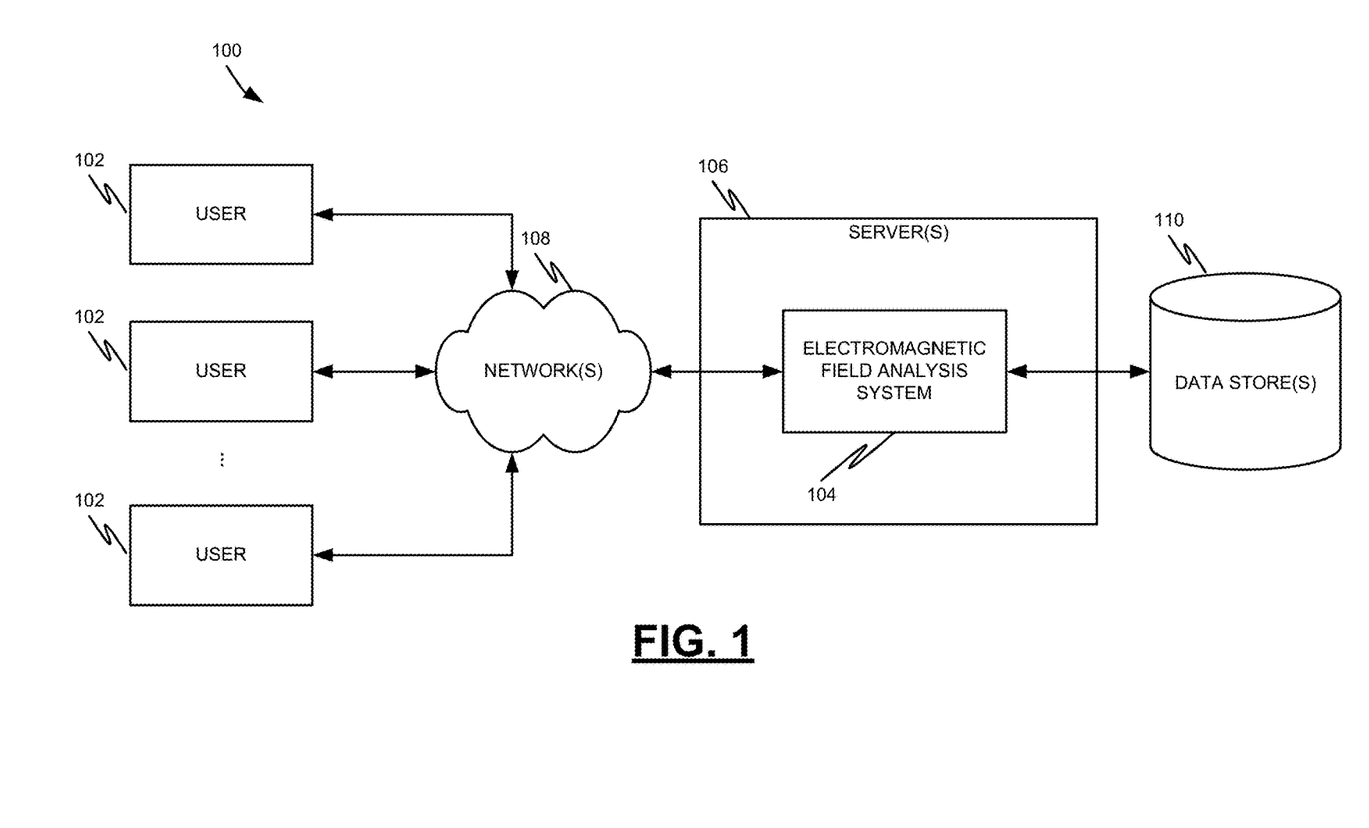
FIG. 1 depicts an example computer-implemented environment wherein users can interact with an electromagnetic field analysis system hosted on one or more servers through a network.

FIG. 1 depicts an example computer-implemented environment wherein users 102 can interact with an electromagnetic field analysis system 104 hosted on one or more servers 106 through a network 108. As shown in FIG. 1, the users 102 can interact with the electromagnetic field analysis system 104 through a number of ways, such as over one or more networks 108. One or more servers 106 accessible through the network(s) 108 can host the electromagnetic field analysis system 104. The one or more servers 106 can also contain or have access to one or more data stores 110 for storing data for the electromagnetic field analysis system 104.

The electromagnetic field analysis system 104 can assist the users 102 to implement a hybrid model which combines the finite element boundary integral (FEBI) method with the method of moments (MoM) and/or the physical optics (PO) for electromagnetic field analysis. Specifically, the electromagnetic field analysis system 104 assists the users 102 to decompose an original domain (e.g., a user-defined domain) into a plurality of sub-domains and solve a final system matrix using a domain-decomposition preconditioner (e.g., K. Zhao and D. K. Sun, "Domain Decomposition Formulations for Simulating Electromagnetic Fields," U.S. Pat. No. 8,510,091, issued Aug. 13, 2013). For example, the electromagnetic field analysis system 104 implements a domain decomposition framework to hybridize different numerical methods (e.g., including the domain decomposition method described in K. Zhao, V. Rawat and J.-F. Lee, "A Domain Decomposition Method for Electromagnetic Radiation and Scattering Analysis of Multi-Target Problems," IEEE Transactions on Antennas and Propagation, vol. 56, pp. 2211-2221, August 2008, incorporated by reference in its entirety herein). In addition, the electromagnetic field analysis system 104 may assist the users 102 to simulate physical properties of an electromagnetic field in the original domain.

In accordance with some embodiments, the electromagnetic field analysis system 104 performs a multi-level domain decomposition method. For example, the electromagnetic field analysis system 104 decomposes the original domain into sub-domains through the concept of domain decomposition, and then applies one or more hybrid methods to each sub-domain for electromagnetic field analysis. The details of an example process are described below.

Figure 2:
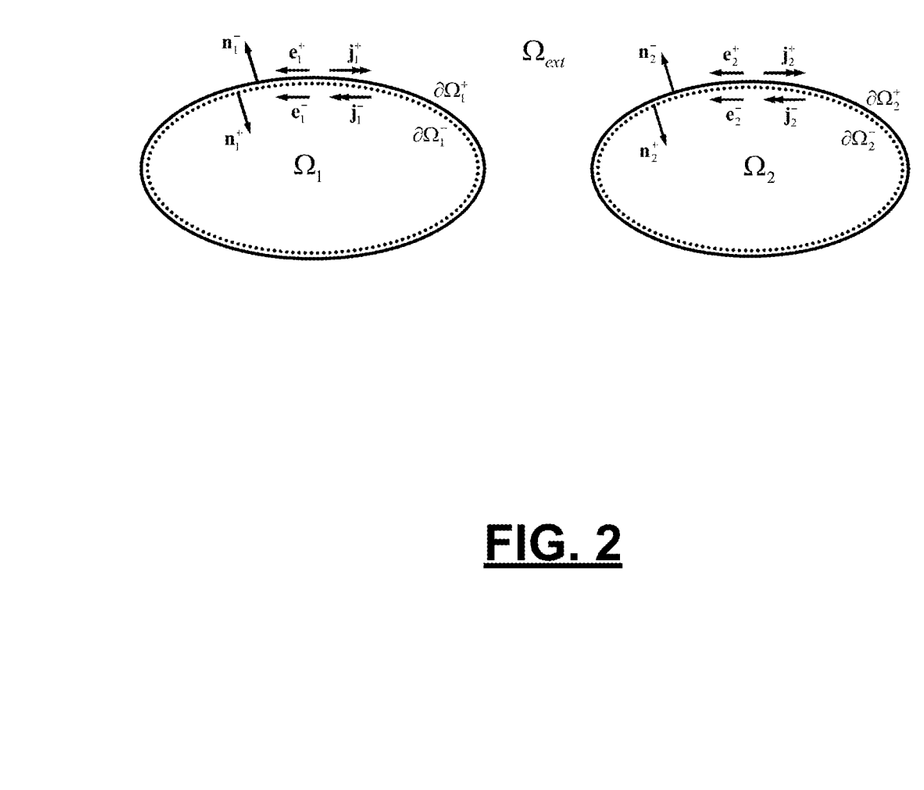
FIG. 2 depicts an example diagram showing domain decomposition related to two finite-element-boundary-integral objects.

Without any loss of generality, a two-object problem as shown in FIG. 2 is used to determine a boundary value statement. As shown in FIG. 2, object i resides in region $\Omega_i$, i=1, 2. Regions are assumed to be well separated and may contain inhomogeneities. A formulation is derived based on a FEBI modeling of both objects (e.g., similar to the FEBI modeling described in K. Zhao, M. N. Vouvakis, and J.-F. Lee, "Solving electromagnetic problems using a novel symmetric FEM-BEM approach," IEEE Trans. Magn., vol. 42, no. 4, pp. 583-587, April, 2006 and M. N. Vouvakis, K. Zhao, S. M. Seo, and J.-F. Lee, "A domain decomposition approach for non-conformal couplings between finite and boundary elements for unbounded electromagnetic problems in $R^3$," J. Comput. Phys., vol. 225, no. 1, pp. 975-994, July, 2007, incorporated by reference in their entirety herein). Infinite unbounded space, $R^3$, is decomposed into three sub-domains: $\Omega_1$, $\Omega_2$, $\Omega_{ext} \equiv R^3 \backslash \Omega_1 \cup \Omega_2$. Subsequently, a boundary value problem (BVP) for $\Omega_i$, i=1, 2, can be stated as:

$$\nabla \times \frac{1}{\mu_{ri}} \nabla \times E_i - k_0^2 \varepsilon_{ri} E_i = -jk_0 \eta J_i^{imp}, \text{ in } \Omega_i, \quad (1)$$

$$j_i^- - e_i^- = -j_i^+ - e_i^+, \text{ on } \partial\Omega_i^-.$$

Here $E_i$ denotes the electric field interior to $\Omega_i$. $k_0$, $\eta$, $\varepsilon_{ri}$, and $\mu_{ri}$ are the free-space wave number, impedance, relative permittivity and permeability of the medium in $\Omega_i$, respectively.

The near-field excitation is expressed via the impressed electric current $J_i^{imp}$. $e_i^- = (\hat{n}_i^- \times E_i \times \hat{n}_i^-)_{\partial\Omega_i^-}$ and $$j_i^- = \frac{1}{jk_0} \hat{n}_i^- \times \left( \frac{1}{\mu_{ri}} \nabla \times E_i \right)_{\partial\Omega_i^-}$$

are the surface electric field and the surface current, respectively, defined on the interior side of the truncation boundary of $\Omega_i$, denoted by $\partial\Omega_i^-$. The derivations described here also apply to any scaling of these variables, such as $J_i^- = \alpha \times j_i^-$ and $E_i^- = \beta \times e_i^-$. Note that $\hat{n}_i^-$ denotes an outwardly directed unit normal from $\Omega_i$ to the exterior region $\Omega_{ext}$. $e_i^+$ and $j_i^+$ represent Huygens' equivalent sources in $\Omega_{ext}$ defined on the exterior side of the truncation boundary of $\Omega_i$, $\partial\Omega_i^+$. The last equation in Eq. (1) is a Robin-type transmission condition (TC) which enforces the continuity of fields across the boundary $\partial\Omega_i$.

The unbounded sub-domain $\Omega_{ext}$ is assumed to be free-space. An integral representation may be a better alternative. Such a representation can be obtained from the Stratton-Chu representation formulae (e.g., similar to those described in J.-C. Nedelec, Acoustic and Electromagnetic Equations, Integral Representations for Harmonic Problems. Berlin, Germany: Springer, 2001, vol. 144, incorporated by reference in its entirety herein) for the electric and magnetic fields and by letting the observation points approach $\partial\Omega_1^+$ and $\partial\Omega_2^+$. As a result, the BVP for $\Omega_{ext}$ is stated as:

$$\frac{1}{2} e_i^+ = e_i^{inc} + \sum_{l=1}^{2} \{\gamma_t(C(m_l^+)) - jk_0 \gamma_t(A(j_l^+)) + (jk_0)^{-1} \nabla_\tau \Psi(j_l^+)\}, \quad (2)$$

$$\text{on } \partial\Omega_i^+,$$

$$\frac{jk_0}{2} j_i^+ = j_i^{inc} + \sum_{l=1}^{2} \{jk_0 \gamma^\times(C(j_l^+)) - k_0^2 \gamma^\times(A(m_l^+)) - \nabla_\tau \Psi(m_l^+)\},$$

$$\text{on } \partial\Omega_i^+,$$

$$j_i^+ - e_i^+ = -j_i^- - e_i^-, \text{ on } \partial\Omega_i^+,$$

where $j^{inc}$ denotes the current producing the incident field $E^{inc}$, and $e_i^{inc} = \gamma_t E_i^{inc} (\equiv \hat{n}_i^+ \times E^{inc} \times \hat{n}_i^+)_{\partial\Omega_i^+}$. Moreover $\hat{n}_i^+ = -\hat{n}_i^-$ and the magnetic current is defined as $$m_i^+ = \gamma^\times e_i^+ (\equiv (\hat{n}_i^+ \times E_i)_{\partial\Omega_i^+}).$$

Furthermore, three integral operators are used:

$$A(x) = \int_{\partial\Omega} xg ds' \quad (3)$$

$$\psi(x) = \int_{\partial\Omega} (\nabla' \bullet x) g ds'$$

$$C(x) = pv \int_{\partial\Omega} x \times \nabla' g ds'$$

where pv indicates integration in the principal value sense, and g is the free-space Green's function.

Based on the trace theorem, $$e_i^\pm \in H_\perp^{-\frac{1}{2}}(\text{curl}_\Gamma, \partial\Omega_i^\pm)$$

and $$j_i^\pm \in H_\parallel^{-\frac{1}{2}}(\text{div}_\Gamma, \partial\Omega_i^\pm).$$

The trace theorem is described in A. Buffa and P. Ciarlet, Jr., "On traces for functional spaces related to Maxell's Equations Part II: Hodge decompositions on the boundary of Lipschitz polyhedra and applications," Math. Mech. Appl. Sci., vol. 24, pp. 31-48, 2001, which is incorporated by reference in its entirety herein. Subsequently, following the symmetric coupling process with the aid of a duality paring concept (e.g., similar to the process described in K. Zhao, V. Rawat, S.-C. Lee, and J.-F. Lee, "A domain decomposition method with non-conformal meshes for finite periodic and semi-periodic structures," IEEE Trans. Antennas Propag., vol. 55, no. 9, pp. 2559-2570, September 2007, incorporated by reference in its entirety herein), the sub-domain matrix for $\Omega_i$, i=1, 2, is obtained as:

$$b(v_i^-, E_i)_{\Omega_i} + \frac{jk_0}{2}\langle \gamma_t v_i^-, j_i^- \rangle_{\partial\Omega_i^-} + \frac{jk_0}{2}\langle \gamma_t v_i^-, e_i^- \rangle_{\partial\Omega_i^-} - \quad (4)$$

$$\frac{jk_0}{2}\langle \gamma_t v_i^-, j_i^+ \rangle_{\partial\Omega_i^-} - \frac{jk_0}{2}\langle \gamma_t v_i^-, e_i^+ \rangle_{\partial\Omega_i^-} = -jk_0\eta(v_i^-, J_i^{imp})_{\Omega_i},$$

$$\frac{jk_0}{2}\langle \lambda_i^-, e_i^- \rangle_{\partial\Omega_i^-} - \frac{jk_0}{2}\langle \lambda_i^-, j_i^- \rangle_{\partial\Omega_i^-} =$$

$$\frac{jk_0}{2}\langle \lambda_i^-, e_i^+ \rangle_{\partial\Omega_i^-} + \frac{jk_0}{2}\langle \lambda_i^-, j_i^+ \rangle_{\partial\Omega_i^-}.$$

where $\forall v_i^- \in H(\text{curl};\Omega_i)$, $$\lambda_i^- \in H_\parallel^{-\frac{1}{2}}(\text{div}_\Gamma, \partial\Omega_i^-).$$

Bilinear forms $b(\bullet, )_\Omega$, $\langle \bullet, \rangle_\Gamma$, and $(\bullet, )_\Omega$ are defined by:

$$b(v, u)_\Omega = \int_\Omega \left[ (\nabla \times v) \cdot \frac{1}{\mu_r}(\nabla \times u) \right] dx^3 - k_0^2 \int_\Omega (v \cdot \varepsilon_r u) dx^3, \quad (5)$$

$$(v, u)_\Omega = \int_\Omega (v \cdot u) dx^3, \langle v, u \rangle_{\partial\Omega} = \int_{\partial\Omega}(v \cdot u) dx^2.$$

The variational form of the exterior problem can be obtained by following a procedure as (e.g., similar to the procedure described in M. N. Vouvakis, K. Zhao, S. M. Seo, and J.-F. Lee, "A domain decomposition approach for non-conformal couplings between finite and boundary elements for unbounded electromagnetic problems in $R^3$," J. Comput. Phys., vol. 225, no. 1, pp. 975-994, July 2007, incorporated by reference in its entirety herein):

$$-\frac{jk_0}{2}\langle \lambda_i^+, j_i^+ \rangle_{\partial\Omega_i^+} - \frac{jk_0}{2}\langle \lambda_i^+, e_i^- \rangle_{\partial\Omega_i^+} - \frac{jk_0}{2}\langle \lambda_i^+, j_i^- \rangle_{\partial\Omega_i^+} + \quad (6)$$

$$\sum_{l=1}^{2}\left\{ jk_0\langle \lambda_i^+, C(m_l^+)\rangle_{\partial\Omega_i^+} + k_0^2\langle \lambda_i^+, A(j_l^+)\rangle_{\partial\Omega_i^+} - \right.$$

$$\left. \langle \nabla_\tau \cdot \lambda_i^+, \Psi(j_l^+)\rangle_{\partial\Omega_i^+} \right\} = -jk_0 \langle \lambda_i^+, e_i^{inc}\rangle_{\partial\Omega_i^+},$$

$$\frac{jk_0}{2}\langle v_i^+, e_i^+ \rangle_{\partial\Omega_i^+} - \frac{jk_0}{2}\langle v_i^+, e_i^- \rangle_{\partial\Omega_i^+} - \frac{jk_0}{2}\langle v_i^+, j_i^- \rangle_{\partial\Omega_i^+} +$$

$$\sum_{l=1}^{2}\left\{ jk_0\langle n_i^+ \times v_i^+, C(j_l^+)\rangle_{\partial\Omega_i^+} - k_0^2\langle n_i^+ \times v_i^+, A(m_l^+)\rangle_{\partial\Omega_i^+} + \right.$$

$$\left. \langle \nabla_\tau \cdot (n_i^+ \times v_i^+), \Psi(m_l^+)\rangle_{\partial\Omega_i^+} \right\} = \langle v_i^+, j_i^{inc}\rangle_{\partial\Omega_i^+}.$$

where $$\forall \lambda_i^+ \in H_\parallel^{-\frac{1}{2}}(\text{div}_\Gamma, \partial\Omega_i^+), v_i^+ \in H_\perp^{-\frac{1}{2}}(\text{curl}_\Gamma, \partial\Omega_i^+), i=1, 2.$$

A system matrix is obtained as:

$$\begin{bmatrix} K_1 & N_{12} \\ N_{12}^T & K_2 \end{bmatrix}\begin{bmatrix} x_1 \\ x_2 \end{bmatrix} = \begin{bmatrix} y_1 \\ y_2 \end{bmatrix}, \quad (7)$$

where $$K_i = \begin{bmatrix} A_{II} & A_{II^-} & 0 & 0 & 0 \\ A_{\Gamma^- I} & A_{\Gamma^-\Gamma^-} + T_{\Gamma^-\Gamma^-} & D_{\Gamma^-\Gamma^-} & -T_{\Gamma^-\Gamma^+} & -D_{\Gamma^-\Gamma^+} \\ 0 & D_{\Gamma^-\Gamma^-}^T & -T_{\Gamma^-\Gamma^-} & -D_{\Gamma^-\Gamma^+}^T & -T_{\Gamma^-\Gamma^+} \\ 0 & -T_{\Gamma^-\Gamma^+}^T & -D_{\Gamma^-\Gamma^+} & Q_{ii} + T_{\Gamma^+\Gamma^+} & P_{ii} \\ 0 & -D_{\Gamma^-\Gamma^+}^T & -T_{\Gamma^-\Gamma^+}^T & P_{ii}^T & -Q_{ii} - T_{\Gamma^+\Gamma^+} \end{bmatrix} \quad (8)$$

$$N_{12} = \begin{bmatrix} 0 & 0 & 0 & 0 & 0 \\ 0 & 0 & 0 & 0 & 0 \\ 0 & 0 & 0 & 0 & 0 \\ 0 & 0 & 0 & Q_{12} & P_{12} \\ 0 & 0 & 0 & P_{12}^T & -Q_{12} \end{bmatrix} x_i = \begin{bmatrix} \tilde{E}_i \\ \tilde{e}_i^- \\ \tilde{j}_i^- \\ \tilde{e}_i^+ \\ \tilde{j}_i^+ \end{bmatrix} y_i = \begin{bmatrix} y_i^I \\ 0 \\ 0 \\ y_i^H \\ y_i^E \end{bmatrix}.$$

The explicit form of matrix sub-blocks $A_{II}$, $A_{II^-}=(A_{\Gamma^- I})^T$, $A_{\Gamma^-\Gamma^-}$ and interior excitation vector $y_i^I$ may be found in S.-C. Lee, M. N. Vouvakis, and J.-F. Lee, "A non-overlapping domain decomposition method with non-matching grids for modeling large finite antenna arrays," J. Comput. Phys., vol. 203, pp. 1-21, February 2005, incorporated by reference in its entirety herein. The remaining sub-blocks are given as:

$$T_{\Gamma^-\Gamma^-} : \frac{jk_0}{2}\langle \gamma_t v^-, \gamma_t v^- \rangle_{\partial\Omega^-}, D_{\Gamma^-\Gamma^-} : \frac{jk_0}{2}\langle \gamma_t v^-, \lambda^- \rangle_{\partial\Omega^-}, \quad (9)$$

$$T_{\Gamma^-\Gamma^+} : \frac{jk_0}{2}\langle \gamma_t v^-, v^+ \rangle_{\partial\Omega^-}, D_{\Gamma^-\Gamma^+} : \frac{jk_0}{2}\langle \gamma_t v^-, \lambda^+ \rangle_{\partial\Omega^-},$$

$$T_{\Gamma^+\Gamma^+} : \frac{jk_0}{2}\langle \lambda^+, \lambda^+ \rangle_{\partial\Omega^+},$$

$$Q_{ij} : -k_0^2 \langle \lambda_i^+, A(\lambda_j^+)\rangle_{\partial\Omega^+} + \langle \nabla_\tau \cdot \lambda_i^+, \Psi(\lambda_j^+)\rangle_{\partial\Omega^+},$$

$$P_{ij} : jk_0 \langle \lambda_i^+, C(\lambda_j^+)\rangle_{\partial\Omega_i^+}.$$

Solution vector $x_i$ contains the unknown coefficients. The BEM excitation vectors, $y_i^H$, $y_i^E$, which are nonzero for scattering problems only, are given as:

$$y_i^H : \langle v^+, j_i^{inc}\rangle_{\partial\Omega_i^+}, y_i^E : -jk_0 \langle \lambda^+, e_i^{inc}\rangle_{\partial\Omega_i^+}. \quad (10)$$

Eq. (7) can be extended to m sub-domains, and the result is:

$$\begin{bmatrix} K_1 & N_{12} & \cdots & N_{1m} \\ N_{21} & K_2 & \cdots & N_{2m} \\ \vdots & \vdots & \ddots & \vdots \\ N_{m1} & N_{m2} & \cdots & K_m \end{bmatrix}\begin{bmatrix} x_1 \\ x_2 \\ \vdots \\ x_m \end{bmatrix} = \begin{bmatrix} y_1 \\ y_2 \\ \vdots \\ y_m \end{bmatrix}. \quad (11)$$

The sub-matrices and the column vectors follow obvious extensions from Eqs. (8)-(10).

Figure 3:
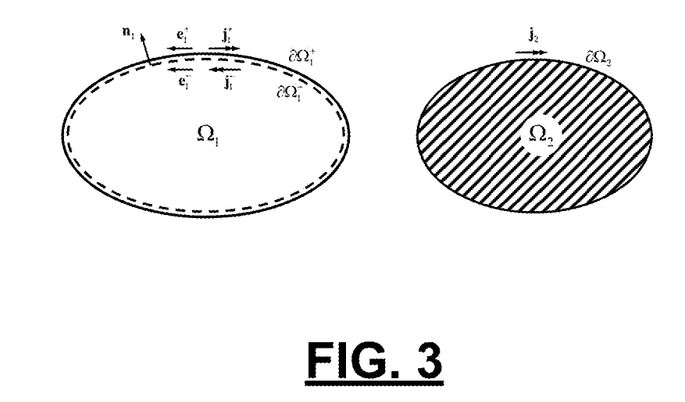
FIG. 3 depicts another example diagram showing domain decomposition related to a finite-element-boundary-integral object and an integral-equation object.

For example, the object $\Omega_1$ contains source excitation and all inhomogeneities and the object $\Omega_2$ is metallic (e.g., as shown in FIG. 3). Assuming the object $\Omega_2$ is a perfect electric conductor (PEC) object, Eq. (2) is modified accordingly:

$$e_2^{inc} - jk_0\gamma_t(A(j_2^+)) + (jk_0)^{-1}\nabla_\tau \Psi(j_2^+) + \gamma_t(C(m_1^+)) - jk_0\gamma_t (A(j_1^+)) + (jk_0)^{-1}\nabla_\tau \Psi(j_1^+) = 0 \text{ on } \partial\Omega_2^+ \quad (12)$$

Following the above-noted procedure, the system matrix changes to $$\begin{bmatrix} K_1 & C_{12} \\ C_{12}^T & -Q_{22} \end{bmatrix} \begin{bmatrix} x_1 \\ x_2 \end{bmatrix} = \begin{bmatrix} y_1 \\ y_2 \end{bmatrix}, \quad (13)$$

where $$C_{12} = \begin{bmatrix} 0 \\ 0 \\ 0 \\ P_{12} \\ -Q_{12} \end{bmatrix}, x_1 = \begin{bmatrix} \tilde{E}_1 \\ \tilde{e}_1^- \\ \tilde{j}_1^- \\ \tilde{e}_1^+ \\ \tilde{j}_1^+ \end{bmatrix}, x_2 = [\tilde{j}_2^+] \quad (14)$$

In accordance with certain embodiments, the electromagnetic field analysis system 104 incorporates the PO solver to adjust the system matrix. For example, Eq. (12) is rewritten as follows:

$$e_2^{inc} + e(j_2^+)|\partial\Omega_2^+ + e(j_1^+, m_1^+)|\partial\Omega_1^+ = 0 \text{ on } \partial\Omega_2^+ \quad (15)$$

where $e(j_2^+)|\partial\Omega_2^+$ indicates the electric field as a function of $j_2^+$ from $\partial\Omega_2^+$. Therefore, the incident field impinging on $\partial\Omega_2^+$ is an electric field. Traditional PO is well known based on an incident magnetic field. Here PO is modified to take an incident electric field directly (e.g., similar to the modification described in S. R. Rengarajan and E. S. Gillespie, "Asymptotic Approximations in Radome Analysis," IEEE Transactions on Antennas and Propagation, vol. 36, pp. 405-414, March 1988, incorporated by reference in its entirety herein).

$$j = \frac{2}{\eta} n \times E^{inc} \times n \quad (16)$$

where $\eta$ is free space wave impedance. Eq. (12) can be written as follows:

$$e_2^{inc} - \frac{1}{2} j_2^+ + \gamma_t(C(m_1^+)) - jk_0\gamma_t(A(j_1^+)) + (jk_0)^{-1}\nabla_\tau \Psi(j_1^+) = 0 \text{ on } \partial\Omega_2^+ \quad (17)$$

Thus, $$\begin{bmatrix} K_1 & C_{12} \\ C_{12}^T & -\frac{1}{2}T_{22} \end{bmatrix} \begin{bmatrix} x_1 \\ x_2 \end{bmatrix} = \begin{bmatrix} y_1 \\ y_2 \end{bmatrix}, \quad (18)$$

As shown in Eq. (18), the dense Q matrix in Eq. (13) is replaced with a sparse mass matrix $-\frac{1}{2}T_{22}$, which results in faster calculation and/or less memory requirement.

In accordance with some embodiments, the electromagnetic field analysis system 104 further decomposes the MoM domain into two sub-regions, i.e., sub-region 1 and sub-region 2. For example, the Q matrix of Eq. (13) which is based on electric field integral equation (EFIE) can be written in a block form as:

$$Q_{22} = \begin{bmatrix} Z_{11} & Z_{12} \\ Z_{12}^T & Z_{22} \end{bmatrix} \quad (19)$$

As an example, the electromagnetic field analysis system 104 directly hybridizes PO with MoM to approximate $Q_{22}$ as follows:

$$Q_{22} \approx \begin{bmatrix} \frac{1}{2}T_{11} & Z_{12} \\ Z_{12}^T & Z_{22} \end{bmatrix} \quad (20)$$

where the sub-region 1 corresponds to a PO region and the sub-region 2 corresponds to a MoM region. As shown in Eq. (20), the dense Q matrix in Eq. (13) is replaced with an approximation matrix $\frac{1}{2} T_{11}$ which corresponds to a sparse mass matrix.

In accordance with some embodiments, the electromagnetic field analysis system 104 hybridizes PO with any existing EFIE solvers. In accordance with certain embodiments, the electromagnetic field analysis system 104 applies the final system matrix (e.g., Eq. (13)) for simulating physical properties of electromagnetic fields of various systems, such as a system including a horizontal dipole and a plate, a system including two reflector antennas, a system including a dipole above a cube, a system including a dipole above a sphere, a system including a dipole closely above a plate, etc.

As described herein, traditional PO is based on magnetic field as $j=2n\times H^{inc}$. PO can be derived from Eq. (15) which is also known as electric field integral equation (EFIE). To incorporate magnetic field based PO, Eq. (15) can be modified to magnetic field integral equation (MFIE) (i.e., Eq. (2)). More explicitly, $$\frac{jk_0}{2} j_2^+ = j^{inc} + jk_0\gamma^\times(C(j_1^+)) - k_0^2\gamma^\times(A(m_1^+)) - \gamma^\times \nabla_\tau \Psi(m_1^+) \quad (21)$$

As described above, the second equation in Eq. (2) from which Eq. (21) is derived can be tested using a curl-conforming basis function. A div-conforming basis function can be employed to test Eq. (21) to avoid a singular sub-domain matrix. This constraint can render it difficult to implement magnetic field based PO in FEBI formulation. As an example, Eq. (21) is tested by $$\lambda_2 \in H_\parallel^{-\frac{1}{2}}(\text{div}_\Gamma, \partial\Omega_2^+).$$

The last term can become $\langle \lambda_2, \gamma\nabla_\tau\Psi(m_1^+)\rangle = \langle n_2\times\lambda_2, \nabla_\tau\Psi(m_1^+)\rangle$. $n_2\times\lambda$ is curl-conforming. Thus, a line integral can be introduced for performing integration by part if a surface gradient is moved into the testing function. If integration by part is not performed, an integral with hyper-singular integrand can be evaluated.

In some embodiments, the electromagnetic field analysis system 104 can be used to overcome the difficulty of implementing magnetic field based PO in FEBI formulation. Specifically, the electromagnetic field analysis system 104 can be used to evaluate accurately the term $\langle \lambda_2, J^{inc} \rangle$, where $J^{inc}$ is the right hand side of Eq. (21). Since $J^{inc}$ is the coupling magnetic field between two non-overlapping regions, it can be represented by both div-($\lambda$) and curl-conforming (v) basis function as:

$$J^{inc} = \sum_i \beta_i \lambda_i = \sum_i \alpha_i v_i \qquad (22)$$

Eq. (22) can be tested by div-($\lambda$) and curl-conforming (v) basis function separately to yield:

$$\langle \lambda, J^{inc} \rangle = T\beta = D\alpha \qquad (23)$$

$$\langle v, J^{inc} \rangle = D^T \beta = T\alpha \qquad (24)$$

Here $T = \langle v, v \rangle = \langle \lambda, \lambda \rangle$ and $D = \langle \lambda, v \rangle$. According to Eq. (24), $\alpha = T^{-1} \langle v, J^{inc} \rangle$. Then Eq. (23) can be rewritten as:

$$\langle \lambda, J^{inc} \rangle = DT^{-1} \langle v, J^{inc} \rangle \qquad (25)$$

With Eq. (25), the final system matrix of magnetic field based FEBI-PO can be written as:

$$\begin{bmatrix} K_1 & C_{12} \\ C_{21} & -\frac{1}{2}T_{22} \end{bmatrix} \begin{bmatrix} x_1 \\ x_2 \end{bmatrix} = \begin{bmatrix} y_1 \\ \tilde{y}_2 \end{bmatrix} \qquad (26)$$

where all symbols except $C_{21}$ and $\tilde{y}_2$ are already defined in Eq. (8) and Eq. (14), and $$C_{21} = [0 \; 0 \; 0 \; DT^{-1}Q_{21} \; DT^{-1}P_{21}] \qquad (27)$$

$$\tilde{y}_2 = DT^{-1} y_2 \qquad (28)$$

Figure 4:
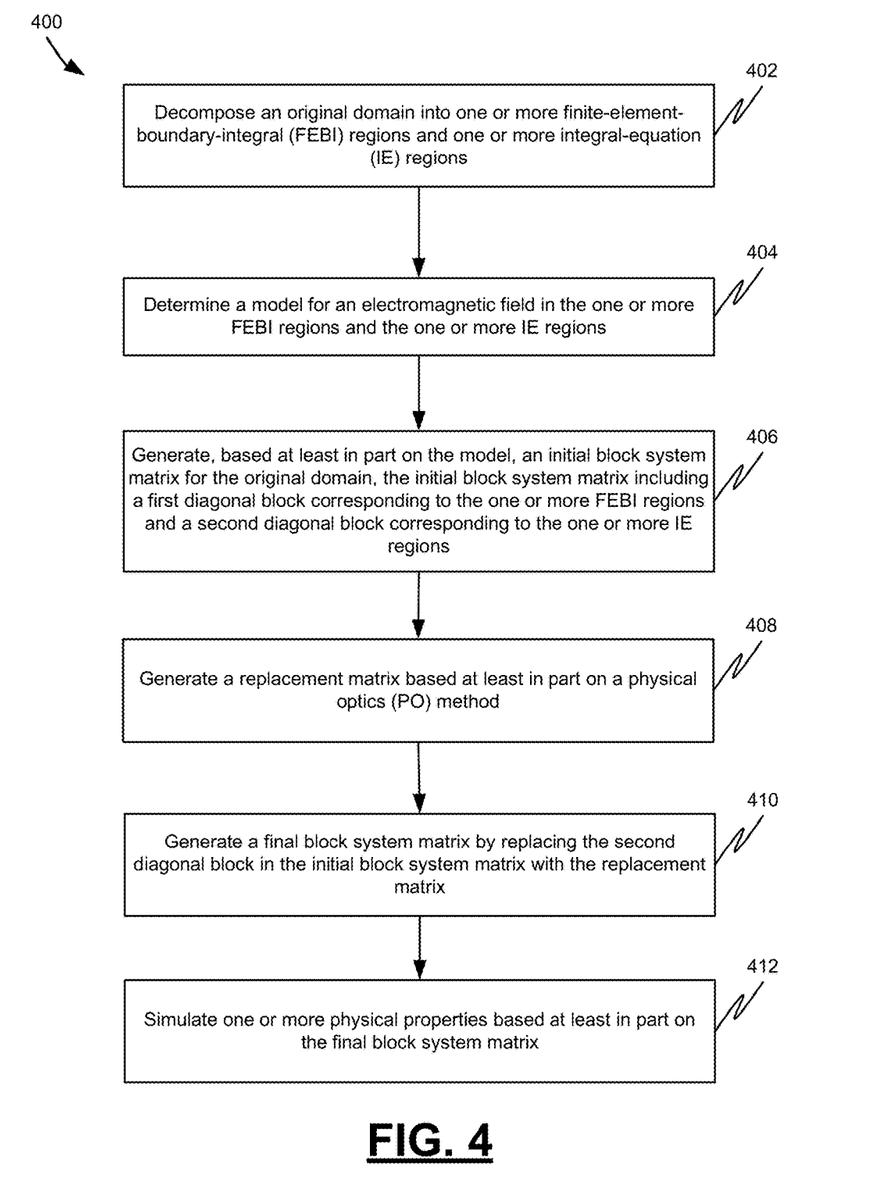
FIG. 4 depicts an example flow chart for analyzing an electromagnetic field in an original domain.

FIG. 4 depicts an example flow chart for analyzing an electromagnetic field in an original domain. At 402, the original domain (e.g., a user-defined domain) is decomposed into one or more finite-element-boundary-integral (FEBI) regions and one or more integral-equation (IE) regions. At 404, a model is determined for an electromagnetic field in the one or more FEBI regions and the one or more IE regions. A truncation surface of the FEBI regions is modeled using one or more Robin-type transmission conditions between a first set of variables and a second set of variables. The first set of variables is associated with a finite element method and the second set of variables is associated with a boundary integral method.

At 406, an initial block system matrix for the original domain is generated based at least in part on the model. The initial block system matrix includes a first diagonal block corresponding to the one or more FEBI regions and a second diagonal block corresponding to the one or more IE regions. At 408, a replacement matrix is generated based at least in part on a PO method. At 410, a final block system matrix is generated by replacing the second diagonal block in the initial block system matrix with the replacement matrix. Initial matrix data associated with the initial block system matrix and final matrix data associated with the final block system matrix are stored in a matrix data structure in a non-transitory computer-readable medium. At 412, one or more physical properties (e.g., electromagnetic fields, network parameters) are simulated based at least in part on the final block system matrix, e.g., as shown in FIG. 5.

Figure 5:
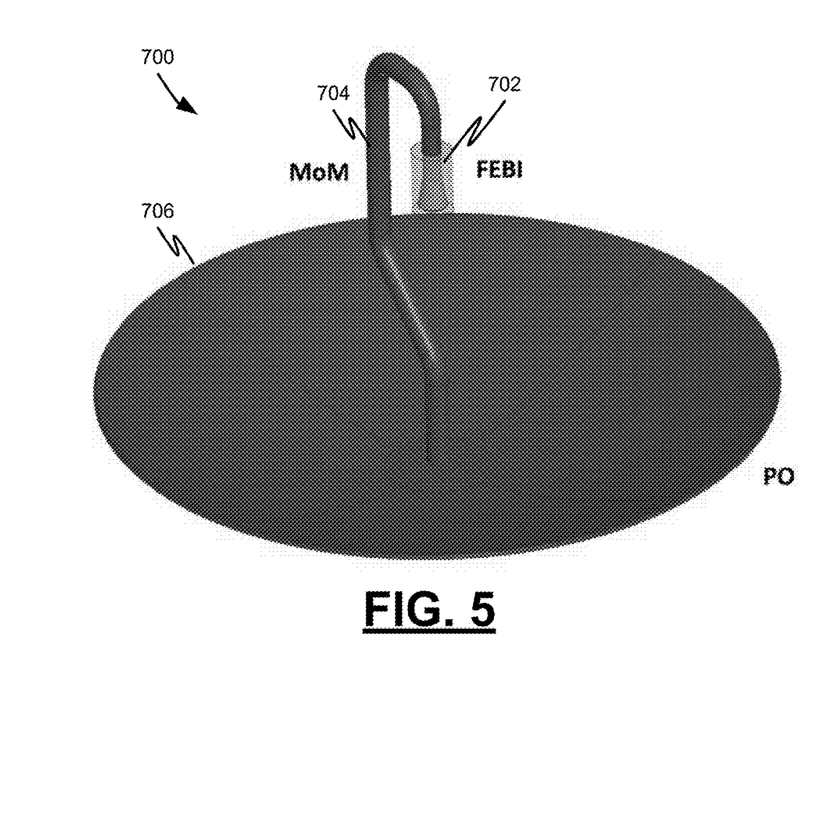
FIG. 5 depicts an example diagram for analyzing an electromagnetic field of a reflector antenna system.

FIG. 5 depicts an example diagram for analyzing an electromagnetic field of a reflector antenna system. The electromagnetic field analysis system 104 (as shown in FIG. 1) combines FEBI with MoM and/or PO to efficiently and accurately analyze the electromagnetic field of the reflector antenna system 700. As shown in FIG. 5, a circular waveguide feed 704 is in direct contact with a circular horn feed 702 and a reflector dish 706. The electromagnetic field analysis system 104 solves an exterior part of the circular waveguide feed 704 using MoM, and solves the circular horn feed 702 with a FEBI enclosed FEM region. In addition, the electromagnetic field analysis system 104 solves the reflector dish 706 with PO.

As an example, at an operating frequency 11.75 GHz, the diameter of the dish 706 is about 30$\lambda$, and the dish 706 is about 9$\lambda$ away from the feed 702, where $\lambda$ is a wavelength associated with the operating frequency. In accordance with some embodiments, the electromagnetic field analysis system 104 performs the analysis with an outer loop Krylov iteration for a relative residual error of $1.0 \times 10^{-3}$. In accordance with certain embodiments, compared with MoM, using PO to solve the dish 706 reduces both the memory requirement and the solution time.

Following an analysis that shows acceptable results, a simulated device may be exported and fabricated. For example, with reference to FIG. 5, parameters of the reflector antenna system may be imported into an electromagnetic field analysis system or may be entered into the field analysis system, such as using CAD or CAD-like functionality. One or more simulations of the reflector antenna system may be performed, with certain parameters of the reflector antenna or its surrounding environment being adjusted between simulation runs. When a design is identified that meets criteria for acceptance, that design is exported from the electromagnetic field analysis system and is used to fabricate a reflector antenna, such as via 3-D printing or other manufacturing techniques.

Figure 6:
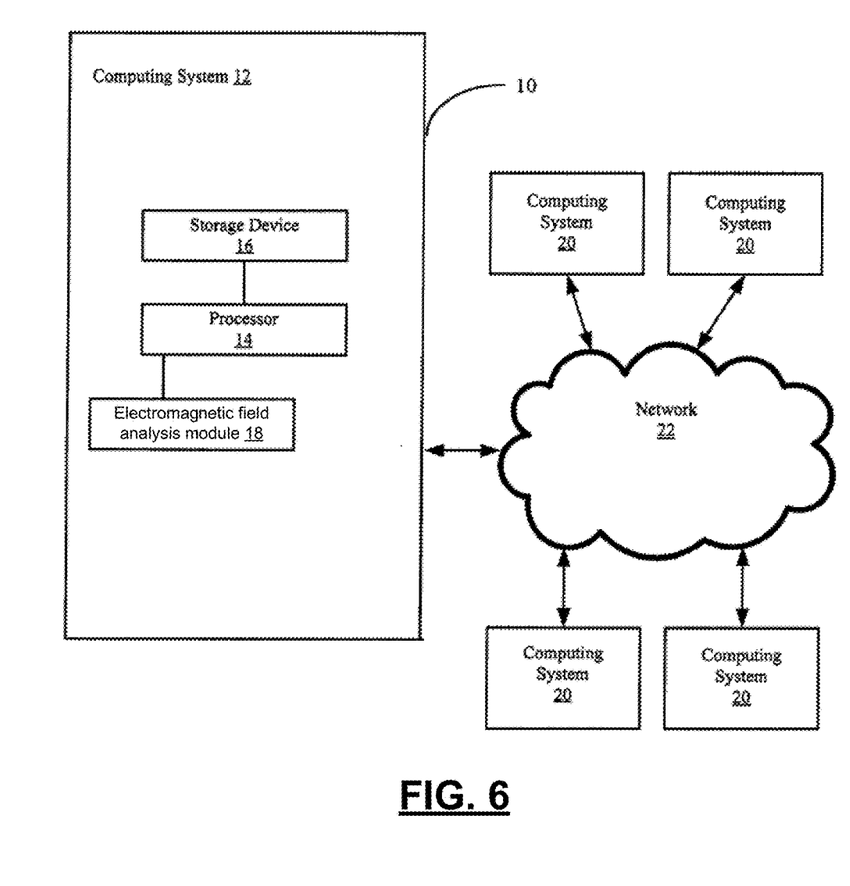
FIG. 6 depicts an example diagram showing a system for analyzing an electromagnetic field in an original domain.

FIG. 6 depicts an example diagram showing a system for analyzing an electromagnetic field in an original domain. As shown in FIG. 6, the system 10 includes a computing system 12 which contains a processor 14, a storage device 16 and an electromagnetic field analysis module 18. The computing system 12 includes any suitable type of computing device (e.g., a server, a desktop, a laptop, a tablet, a mobile phone, etc.) that includes the processor 14 or provide access to a processor via a network or as part of a cloud based application. The electromagnetic field analysis module 18 includes tasks and is implemented as part of a user interface module (not shown in FIG. 6).

Figure 7:
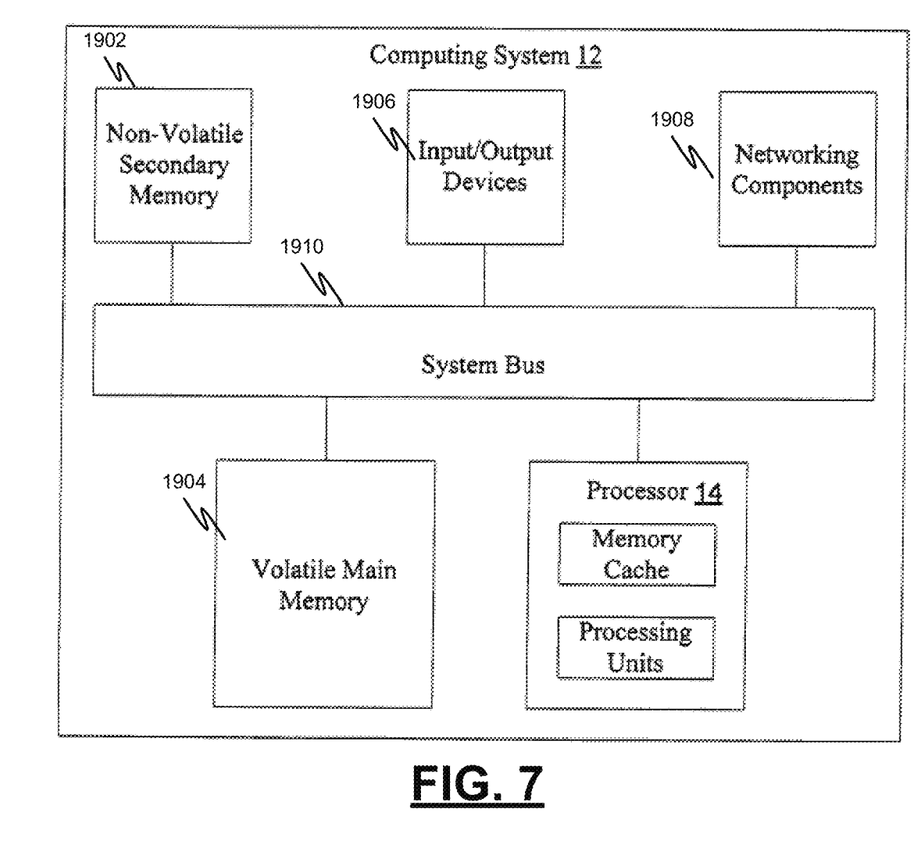
FIG. 7 depicts an example diagram showing a computing system for analyzing an electromagnetic field in an original domain.

FIG. 7 depicts an example diagram showing a computing system for analyzing an electromagnetic field in an original domain. As shown in FIG. 7, the computing system 12 includes a processor 14, memory devices 1902 and 1904, one or more input/output devices 1906, one or more networking components 1908, and a system bus 1910. In some embodiments, the computing system 12 includes the electromagnetic field analysis module 18, and provides access to the electromagnetic field analysis module 18 to a user as a stand-alone computer.

This written description uses examples to disclose the invention, including the best mode, and also to enable a person skilled in the art to make and use the invention. The patentable scope of the invention may include other examples. For example, the systems and methods may include data signals conveyed via networks (e.g., local area network, wide area network, internet, combinations thereof, etc.), fiber optic medium, carrier waves, wireless networks, etc. for communication with one or more data processing devices. The data signals can carry any or all of the data disclosed herein that is provided to or from a device.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of non-transitory computer-readable storage medium that is stored at a single location or distributed across multiple locations. The medium can include computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The systems and methods may be provided on many different types of computer-readable media including computer storage mechanisms (e.g., CD-ROM, diskette, RAM, flash memory, computer's hard drive, etc.) that contain instructions (e.g., software) for use in execution by a processor to perform the methods' operations and implement the systems described herein.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example, as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

What is claimed is:

1. A processor-implemented method for simulating a physical system, the method comprising:
    decomposing an original domain associated with the physical system into one or more finite-element-boundary-integral (FEBI) regions and one or more integral-equation (IE) regions;
    determining a model for an electromagnetic field of the physical system in the one or more FEBI regions and the one or more IE regions;
    wherein a truncation surface of the FEBI regions is modeled using one or more Robin-type transmission conditions between a first set of variables and a second set of variables;
    wherein the first set of variables is associated with a finite element method and the second set of variables is associated with a boundary integral method;
    generating, based at least in part on the model, an initial block system matrix for the original domain, the initial block system matrix including a first diagonal block corresponding to the one or more FEBI regions and a second diagonal block corresponding to the one or more IE regions;
    generating a replacement matrix based at least in part on a physical optics (PO) method;
    generating a final block system matrix by replacing the second diagonal block in the initial block system matrix with the replacement matrix;
    wherein initial matrix data associated with the initial block system matrix and final matrix data associated with the final block system matrix are stored in a matrix data structure in a non-transitory computer-readable medium; and
    determining physical properties of a simulated device based on the final block system matrix, the simulated device for building or modifying the physical system, wherein:
        the original domain is further decomposed into one or more unbounded regions exterior to the one or more FEBI regions and the one or more IE regions, and
        the PO method is applied to determine a surface current based on (i) an incident electric field, (ii) a free space wave impedance, (iii) an outwardly directed unit vector, (iv) the one or more IE regions, and (v) the one or more unbounded regions.

2. The method of claim 1, wherein the replacement matrix is generated using only the PO method.

3. The method of claim 1, wherein the replacement matrix is generated using a combination of the IE method and the PO method.

4. The method of claim 1, wherein:
    the original domain includes a circular waveguide feed in direct contact with a circular horn feed and a reflector dish;
    physical properties of the electromagnetic field related to the circular waveguide feed are determined based at least in part on a method of moments (MoM);
    the physical properties of the electromagnetic field related to the circular horn feed are determined based at least in part on a FEBI enclosed FEM region; and
    the physical properties of the electromagnetic field related to the reflector dish are determined based at least in part on the PO method.

5. The method of claim 1, wherein the replacement matrix corresponds to a sparse mass matrix.

6. The method of claim 1, wherein the one or more Robin-type transmission conditions are used for enforcing continuity of the electromagnetic field across the one or more truncation boundaries associated with the one or more FEBI regions or the one or more IE regions.

7. The method of claim 1, wherein the PO method is applied according to the following equation:

$$j = \frac{2}{\eta} n \times E^{inc} \times n$$

where j represents the surface current, $E^{inc}$ represents the incident electric field, $\eta$ represents the free space wave impedance, and n represents the outwardly directed unit vector normal from the one or more IE regions to the one or more unbounded regions.

8. The method of claim 1, wherein the one or more IE regions include a perfect electric conductor.

9. The method of claim 1, wherein the generation of the initial block system matrix for the original domain includes:

determining an original system matrix based at least in part on the combination of a finite element method and a boundary integral method; and determining the initial block system matrix for the electromagnetic field using the original system matrix based at least in part on a method of moments.

10. The method of claim 1, wherein the model is determined based on one or more model variables or scaling of the model variables.

11. The method of claim 10, wherein the model variables include a surface electric field and a surface current.

12. The method of claim 1, wherein the original domain includes a physical part design, wherein one or more physical properties of the physical part design are simulated based at least in part on the final block system matrix, wherein the method further comprises:

exporting the physical part design for fabrication; and
fabricating a physical part based on the exported physical part design.

13. The method of claim 1, wherein the physical system comprises a horizontal dipole and a plate.

14. The method of claim 1, wherein the physical system comprises two reflector antennas.

15. The method of claim 1, wherein the physical system comprises a dipole above a cube.

16. The method of claim 1, wherein the physical system comprises a dipole above a sphere.

17. The method of claim 1, wherein the physical system comprises a dipole above a plate.

18. The method of claim 1, wherein determining the model for the electromagnetic field of the physical system further comprises a coupling magnetic field between two non-overlapping regions.

19. A computer-implemented system for simulating a physical system, the system comprising:

one or more data processors; and
one or more computer-readable storage media encoded with instructions for commanding the one or more data processors to execute operations including:
  decomposing an original domain associated with the physical system into one or more finite-element-boundary-integral (FEBI) regions and one or more integral-equation (IE) regions;
  determining a model for an electromagnetic field of the physical system in the one or more FEBI regions and the one or more IE regions;
  wherein a truncation surface of the FEBI regions is modeled using one or more Robin-type transmission conditions between a first set of variables and a second set of variables;
  wherein the first set of variables is associated with a finite element method and the second set of variables is associated with a boundary integral method;
  generating, based at least in part on the model, an initial block system matrix for the original domain, the initial block system matrix including a first diagonal block corresponding to the one or more FEBI regions and a second diagonal block corresponding to the one or more IE regions;
  generating a replacement matrix based at least in part on a physical optics (PO) method;
  generating a final block system matrix by replacing the second diagonal block in the initial block system matrix with the replacement matrix;
  wherein initial matrix data associated with the initial block system matrix and final matrix data associated with the final block system matrix are stored in a matrix data structure in a non-transitory computer-readable medium; and
  determining physical properties of a simulated device based on the final block system matrix, the simulated device for building or modifying the physical system, wherein:
    the original domain is further decomposed into one or more unbounded regions exterior to the one or more FEBI regions and the one or more IE regions, and
    the PO method is applied to determine a surface current based on (i) an incident electric field, (ii) a free space wave impedance, (iii) an outwardly directed unit vector, (iv) the one or more IE regions, and (v) the one or more unbounded regions.

20. The system of claim 19, wherein the generation of the initial block system matrix for the original domain includes:

determining an original system matrix based at least in part on the combination of a finite element method and a boundary integral method; and
determining the initial block system matrix for the electromagnetic field using the original system matrix based at least in part on a method of moments.

21. A computer-readable medium encoded with instructions for commanding one or more data processors to execute operations of a method for simulating a physical system, the method comprising:

decomposing an original domain associated with the physical system into one or more finite-element-boundary-integral (FEBI) regions and one or more integral-equation (IE) regions;
determining a model for an electromagnetic field of the physical system in the one or more FEBI regions and the one or more IE regions;
wherein a truncation surface of the FEBI regions is modeled using one or more Robin-type transmission conditions between a first set of variables and a second set of variables;
wherein the first set of variables is associated with a finite element method and the second set of variables is associated with a boundary integral method;
generating, based at least in part on the model, an initial block system matrix for the original domain, the initial block system matrix including a first diagonal block corresponding to the one or more FEBI regions and a second diagonal block corresponding to the one or more IE regions;
generating a replacement matrix based at least in part on a physical optics (PO) method;
generating a final block system matrix by replacing the second diagonal block in the initial block system matrix with the replacement matrix;
wherein initial matrix data associated with the initial block system matrix and final matrix data associated with the final block system matrix are stored in a matrix data structure in a non-transitory computer-readable medium; and
determining physical properties of a simulated device based on the final block system matrix, the simulated device for building or modifying the physical system, wherein:
  the original domain is further decomposed into one or more unbounded regions exterior to the one or more FEBI regions and the one or more IE regions, and the PO method is applied to determine a surface current based on (i) an incident electric field, (ii) a free space wave impedance, (iii) an outwardly directed unit vector, (iv) the one or more IE regions, and (v) the one or more unbounded regions.

22. A processor-implemented method for simulating a physical system, the method comprising:

decomposing an original domain associated with the physical system into one or more finite-element-boundary-integral (FEBI) regions and one or more integral-equation (IE) regions;

determining a model for an electromagnetic field of the physical system in the one or more FEBI regions and the one or more IE regions;

wherein a truncation surface of the FEBI regions is modeled using one or more Robin-type transmission conditions between a first set of variables and a second set of variables;

wherein the first set of variables is associated with a finite element method and the second set of variables is associated with a boundary integral method;

generating, based at least in part on the model, an initial block system matrix for the original domain, the initial block system matrix including a first diagonal block corresponding to the one or more FEBI regions and a second diagonal block corresponding to the one or more IE regions;

generating a replacement matrix based at least in part on a physical optics (PO) method;

generating a final block system matrix by replacing the second diagonal block in the initial block system matrix with the replacement matrix;

wherein initial matrix data associated with the initial block system matrix and final matrix data associated with the final block system matrix are stored in a matrix data structure in a non-transitory computer-readable medium; and determining physical properties of a simulated device based on the final block system matrix, the simulated device for building or modifying the physical system, wherein:

the original domain is further decomposed into one or more unbounded regions exterior to the one or more FEBI regions and the one or more IE regions, and the PO method is applied to determine a surface current based on (i) an incident magnetic field, (ii) an outwardly directed unit vector, (iii) a one or more second sub-domains, and (iv) an exterior sub-domain in the original domain.

23. The method of claim 22, wherein the PO method is applied according to the following equation:

$$j=2n \times H^{inc}$$

where j represents the surface current, $H^{inc}$ represents the incident magnetic field and n represents the outwardly directed unit vector normal from the one or more second sub-domains to the exterior sub-domain in the original domain.

* * * * *